US009058888B2

(12) United States Patent
Milani et al.

(10) Patent No.: US 9,058,888 B2
(45) Date of Patent: Jun. 16, 2015

(54) CONTROL CIRCUITRY FOR MEMORY CELLS

(75) Inventors: Luca Milani, Mairano (IT); Kwangseok Han, Cambridge (GB); Rainer Herberholz, Cambridge (GB); Justin Penfold, Bury St. Edmunds (GB)

(73) Assignee: CAMBRIDGE SILICON RADIO LIMITED, Cambridge (GB)

( * ) Notice: Subject to any disclaimer, the term of this patent is extended or adjusted under 35 U.S.C. 154(b) by 225 days.

(21) Appl. No.: 13/494,283

(22) Filed: Jun. 12, 2012

(65) Prior Publication Data

US 2012/0314508 A1 Dec. 13, 2012

(30) Foreign Application Priority Data

Jun. 13, 2011 (GB) .................................. 1109822.5

(51) Int. Cl.
*G11C 19/08* (2006.01)
*G11C 17/18* (2006.01)
*G11C 16/04* (2006.01)
(Continued)

(52) U.S. Cl.
CPC ............ *G11C 17/18* (2013.01); *G11C 16/0475* (2013.01); *G11C 17/14* (2013.01); *G11C 17/146* (2013.01); *G11C 29/027* (2013.01); *G11C 29/785* (2013.01); *G11C 2029/0409* (2013.01);
(Continued)

(58) Field of Classification Search
CPC .... G11C 17/18; G11C 29/785; G11C 29/027; G11C 16/0475; G11C 17/146; G11C 2029/5006; G11C 17/14; G11C 2029/0409; H01L 27/11206

USPC .......................... 365/185.28, 189.06
See application file for complete search history.

(56) References Cited

U.S. PATENT DOCUMENTS 5,835,402 A * 11/1998 Rao et al. ...................... 365/149
5,852,313 A * 12/1998 Hong et al. ................... 257/326
(Continued)

FOREIGN PATENT DOCUMENTS

JP        08330944 A     12/1996
WO    2010096915 A1      9/2010

OTHER PUBLICATIONS

Milani, L., "A Novel OTP Non-Volatile Memory on 40nm Integrated CMOS Technology: Characterisation & Design," University Degli Studi Di Brescia Facoltà Di Ingegneria, submitted Mar. 12, 2010.
(Continued)

*Primary Examiner* — Richard Elms
*Assistant Examiner* — Mohammed A Bashar
(74) *Attorney, Agent, or Firm* — John W. Branch; Lowe Graham Jones PLLC

(57) ABSTRACT

Control circuitry for memory cells is described. In an embodiment, a breakdown detection circuit is described which is arranged to detect abnormally high currents indicative of a defective cell during programming of a memory cell through monitoring the impedance level at a terminal in the breakdown detection circuit. The breakdown detection circuit is connected between the device being programmed and ground and comprises three transistors, at least one of which is capable of withstanding the programming voltage in case of breakdown. Other embodiments describe a flag bit cell design, a memory array and methods of reading and writing from/to that array, and circuitry for biasing a memory wordline for both read and write operations. The embodiments may be used separately or in a combination.

8 Claims, 8 Drawing Sheets

(51) Int. Cl.
  *G11C 29/02*  (2006.01)
  *G11C 29/00*  (2006.01)
  *H01L 27/112*  (2006.01)
  *G11C 17/14*  (2006.01)
  *G11C 29/04*  (2006.01)
  *G11C 29/50*  (2006.01)

(52) U.S. Cl.
  CPC .. *G11C 2029/5006* (2013.01); *H01L 27/11206* (2013.01)

(56) References Cited

U.S. PATENT DOCUMENTS

| | | |
|---|---|---|
| 6,133,778 A | 10/2000 | Kim et al. |
| 8,122,307 B1 | 2/2012 | Lindhorst et al. |
| 2004/0041167 A1 | 3/2004 | Marr et al. |
| 2006/0092742 A1 | 5/2006 | Paillet et al. |
| 2006/0244510 A1 | 11/2006 | Choi et al. |
| 2007/0133259 A1 | 6/2007 | Kim |
| 2008/0247213 A1* | 10/2008 | Fasoli et al. .......... 365/105 |
| 2010/0202183 A1 | 8/2010 | Kurjanowicz |
| 2010/0277999 A1 | 11/2010 | Do |

OTHER PUBLICATIONS

Milani, L. "Una nuova memoria non volatile OTP in tecnologia CMOS integrata da 40nm: caratterizazione & progetto," Mar. 22, 2010, 11 pages.

Search Report in Great Britain Patent Appliction No. 1109822.5 mailed Sep. 14, 2012.

* cited by examiner

CONTROL CIRCUITRY FOR MEMORY CELLS

CROSS-REFERENCE TO RELATED APPLICATIONS

This application claims priority to U.K. Patent Application Serial No. GB1109822.5 filed on Jun. 13, 2011, the contents of which are incorporated herein by reference.

BACKGROUND

The scaling of CMOS technology leads to a greater difficulty in the integration of both floating gate memory and logic together for high performance and low power system-on-chip (SoC). Floating gate memory can provide embedded multi-time programmable memory (MTP), Electrically Erasable Programmable Read-Only Memory (EEPROM) and Flash memory and is typically 2 or 3 nodes behind leading edge CMOS technology, because of the complexity of integrating additional processing (which also increases the costs). As a result, one-time programmable (OTP) memory is being used increasingly for embedded non-volatile memory (NVM) applications.

In an OTP memory it is impossible to exercise the memory during testing to identify any defective cells. Conventionally the OTP memory is programmed at chip test and so the final programmed device can be tested before the device is shipped to a customer and devices which have not been programmed correctly can be screened out. However, where such cells are programmed during the operation of the device, this is not possible, and this is exacerbated where large numbers of OTP cells are used in this manner.

The embodiments described below are not limited to implementations which solve any or all of the disadvantages of known OTP elements and associated control circuitry.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Control circuitry for memory cells is described. In an embodiment, a breakdown detection circuit is described which is arranged to detect abnormally high currents indicative of a defective cell during programming of a memory cell through monitoring the impedance level at a terminal in the breakdown detection circuit. The breakdown detection circuit is connected between the device being programmed and ground and comprises three transistors, at least one of which is capable of withstanding the programming voltage in case of breakdown. Other embodiments describe a flag bit cell design, a memory array and methods of reading and writing from/to that array, and circuitry for biasing a memory word-line for both read and write operations. The embodiments may be used separately or in any combination.

A first aspect provides a breakdown detection circuit for detecting abnormally high currents during programming of a memory cell at a programming voltage, the circuit comprising a first NMOS transistor, a second NMOS transistor and a third NMOS transistor, wherein the third transistor is arranged to sustain the programming voltage in case of breakdown and each transistor comprises a drain terminal, a source terminal and a gate terminal and wherein: the drain terminal of the third transistor is connectable to a bit-line terminal of a memory cell; the source of the third transistor is connected to both a drain of the first transistor and the gate of the second transistor; the source terminals of both the first and second transistors are connected to ground; and the gate terminal of the first transistor is connected to a current reference module; and wherein in use, the gate terminal of the third transistor is biased to switch the third transistor on and an impedance of the drain terminal of the second transistor provides an indication of a breakdown event during programming.

The memory cell may comprise at least one memory device programmed using Fowler-Nordheim Tunneling.

The at least one memory device may comprise a one-time-programmable transistor, the one-time-programmable transistor comprising a thick oxide layer and source/drain extensions which are highly-doped, shallow and with pockets.

The breakdown detection circuit may further comprise the current reference module.

The current reference module may comprise a fourth NMOS transistor and a reference current source, wherein the reference current source is connected to both the drain and gate terminal of the fourth transistor and to the gate terminal of the first transistor, and wherein the source of the fourth transistor is connected to ground.

In use and during breakdown, the first NMOS transistor may be arranged to act as a current limiter within the breakdown detection circuit and the memory array. The current reference module is arranged to set the current limit.

A second aspect provides a flag memory cell comprising four one-time programmable transistors, each one-time programmable transistor comprising a source, a drain and a gate terminal and wherein: all four gate terminals are connected together to provide a single gate connection; a source terminal of a first of the four one-time programmable transistors is connected to a drain of a second of the four one-time programmable transistors; a source terminal of a fourth of the four one-time programmable transistors is connected to an drain terminal of a third of the four one-time programmable transistors; the first and fourth one-time programmable transistors of the four one-time programmable transistors are of substantially identical design; and the second and third one-time programmable transistors of the four one-time programmable transistors are mismatched.

The second and third one-time programmable transistors of the four one-time programmable transistors may comprise active areas of different widths and the first and fourth one-time programmable transistors of the four one-time programmable transistors may comprise active areas of substantially identical widths.

The width of the active area of the second one-time programmable transistor may be half the width of the active area of the third one-time programmable transistor.

A third aspect provides a circuit for providing a first bias voltage to at least one memory word-line within a memory array for write operations and a second bias voltage to the at least one memory word-line within the memory array for read operations, the circuit comprising: a cascode; a latch connected between a bias line and the cascode; two input NMOS transistors each comprising a drain connected to the cascode, a source connected to ground and a gate terminal connected to a low-voltage logic input to the circuit; an output stage comprising a PMOS output transistor and an NMOS output transistor, the PMOS output transistor comprising source terminal connected to the bias line, a drain terminal connected to the word-line and a gate terminal connected to the latch and the NMOS output transistor comprising a drain terminal connected to the word-line, a source terminal connected to ground and a gate terminal connected to the cascode; and bypass circuitry arranged to short circuit the cascode during read operations.

The cascode may comprise two PMOS transistors and two NMOS transistors and the latch may comprise two PMOS transistors and wherein: each transistor in the latch comprises a source terminal connected to the bias line and a gate terminal connected to a drain terminal of the other transistor in the latch; the two PMOS transistors in the cascode each comprise a source terminal connected to a drain terminal of one of the transistors in the latch and a gate terminal connected to a first control voltage; a first of the NMOS transistors in the cascode comprises a drain terminal connected to the drain terminal of a first of the PMOS transistors in the cascode, a source terminal connected to the drain terminal of one of the input transistors and a gate terminal connected to a second control voltage; and a second of the NMOS transistors in the cascode comprises a drain terminal connected to the drain terminal of a second of the PMOS transistors in the cascode, a source terminal connected to the drain terminal of another of the input transistors, and a gate terminal connected to the second control voltage.

The bypass circuitry may comprise two switches, the first switch being connected between a drain terminal of a first of two PMOS transistors in the latch and a drain terminal of a first of the two input NMOS transistors and the second switch being connected between a drain terminal of a second of the two PMOS transistors in the latch and a drain terminal of a second of the two input NMOS transistors.

A fourth aspect provides a memory element comprising: a memory cell and a breakdown detection circuit as described above.

The memory element may further comprise an array of memory cells with word-lines arranged as columns and bit-lines as rows and wherein the breakdown detection circuit is connectable to each memory cell bit-line in a row within the array.

The memory element may further comprise at least one additional breakdown detection circuit, each breakdown detection circuit being connectable to each memory cell in a bit-line.

A single current reference module may be connected to each of the breakdown detection circuits.

The memory element may further comprise a flag memory cell as described above.

The memory element may further comprise an array of memory cells, the array comprising at least one bit-line row of flag memory cells as described above and a plurality of bit-line rows of memory cells comprising one-time-programmable transistors, wherein each memory cell in a bit-line comprising memory cells as described above is arranged to store a bit of data indicating if a word-line containing that memory cell is free or used.

Each memory cell in a second bit-line row may be arranged, in use, to store a bit of data indicating if data written to a previous word-line is valid data.

The memory element may further comprise a worddrive circuit as described above.

A fifth aspect provides a method of detecting breakdown during programming of a memory cell at a programming voltage, the memory cell comprising one or more one-time-programmable transistors, the method comprising: connecting a bit-line terminal of the memory cell being programmed to ground through a breakdown detection circuit, the breakdown detection circuit comprising a first NMOS transistor, a second NMOS transistor and a third NMOS transistor, wherein the third NMOS transistor is arranged to sustain the programming voltage in case of breakdown and each transistor comprises a drain terminal, a source terminal and a gate terminal and wherein the drain terminal of the third transistor is connectable to the bit-line terminal of the memory cell being programmed; the source terminal of the third transistor is connected to both a drain terminal of the first transistor and the gate terminal of the second transistor; the source terminals of both the first and second transistors are connected to ground; and the gate terminal of the first transistor is connected to a current reference module; applying a bias voltage to the gate terminal of the third transistor in the breakdown detection circuit to switch the third transistor on; and monitoring an impedance of the second transistor in the breakdown detection circuit.

Further aspects provide:
a breakdown detection circuit substantially as described with reference to FIG. 2 of the drawings;
a flag bit memory cell substantially as described with reference to FIG. 3 of the drawings;
a memory array substantially as described with reference to FIG. 4 of the drawings;
a worddrive circuit substantially as described with reference to FIG. 7 of the drawings;
a method of operating a memory array substantially as described with reference to FIG. 5 or 6 of the drawings; and
a method of detecting breakdown during programming of a memory cell substantially as described with reference to FIG. 2 of the drawings.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Figure 1:
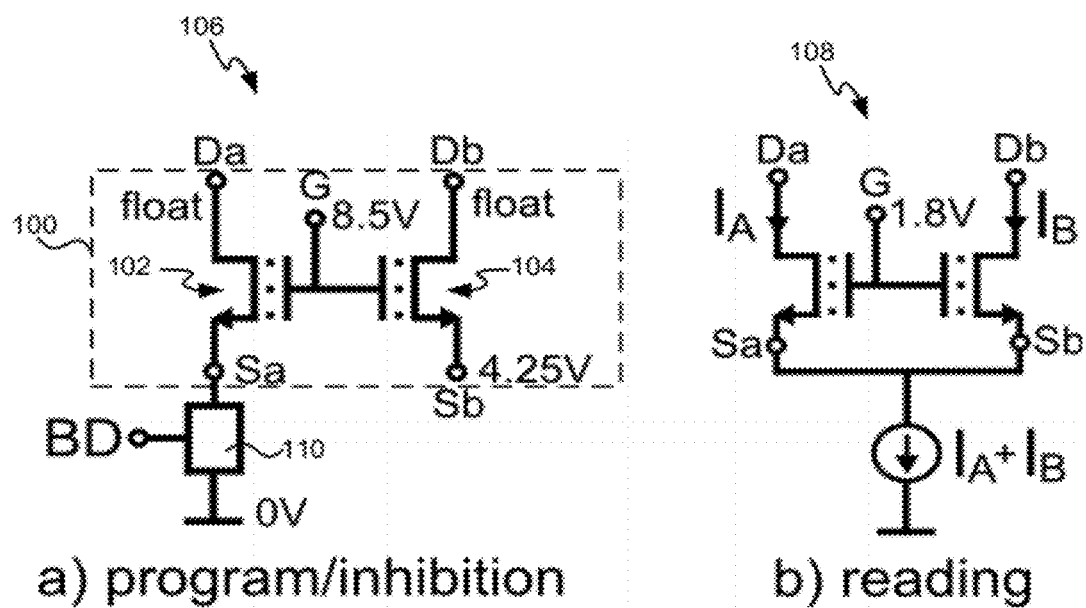
FIG. 1 shows a memory bit-cell which comprises two programmable MOS transistors arranged as a differential pair where data is stored as the threshold voltage difference between the two MOS devices.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Memory Bit-Cell

FIG. 1 shows a memory bit-cell 100 which comprises two programmable MOS transistors 102, 104 arranged as a differential pair where data is stored by introducing a difference in the current/voltage characteristics between the two MOS devices 102, 104. In an un-programmed (or native) state such a bit-cell does not store any data and if read would give an unpredictable value as a consequence of the native mismatch of the two MOS devices.

Figure 8:
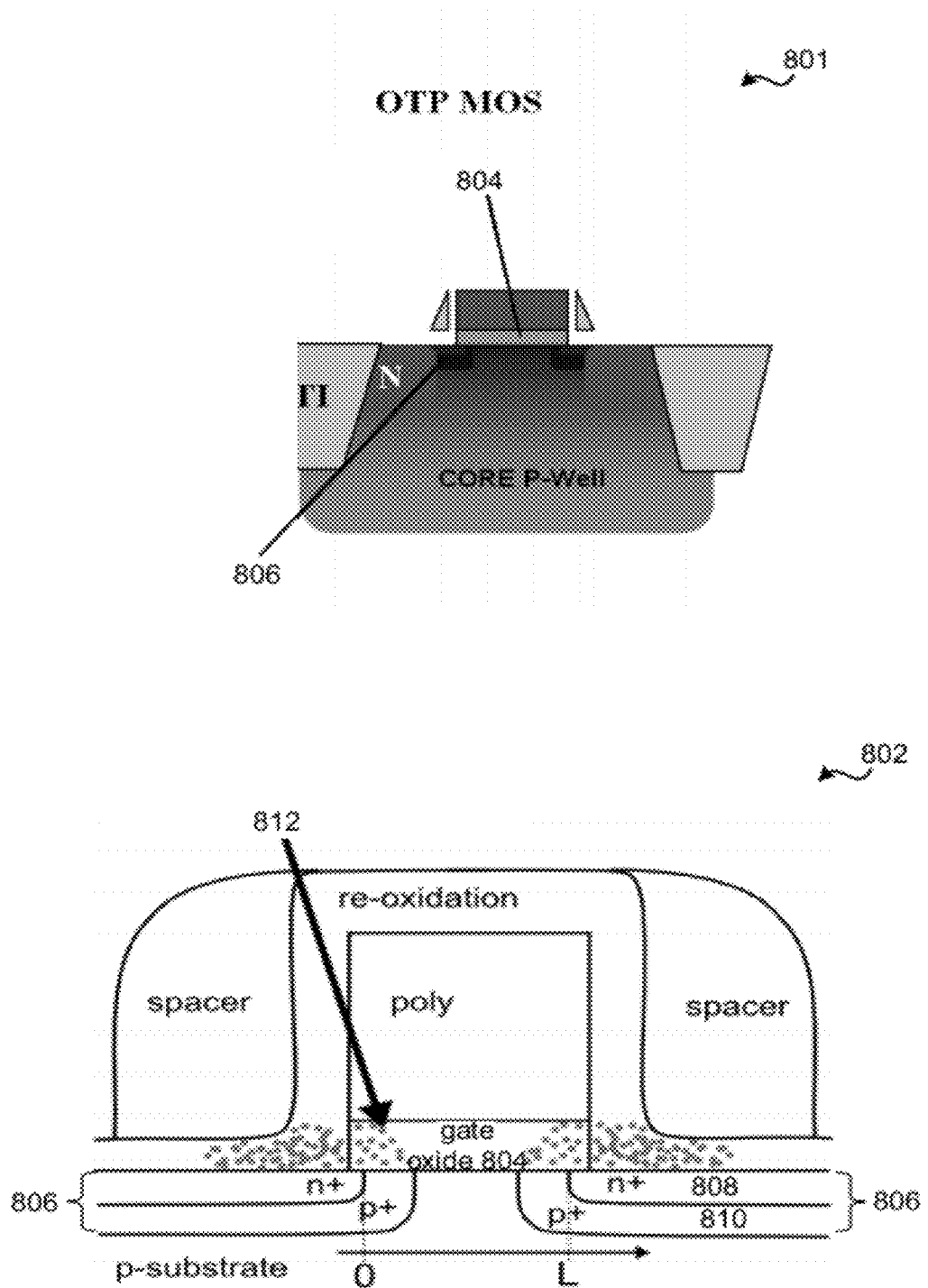
FIG. 8 shows two cross-sectional diagrams through an example OTP transistor with charge-trapping sites.

The memory bit-cell (which may also be referred to as the device) has five independent terminals: the source connections to each device (Sa, Sb), the drain connections to each device (Da, Db) and a common gate connection (G).). All NMOS devices are placed inside the same P-Well or substrate, therefore they have common bulk terminal which may be connected to ground. The circuit symbols used in FIG. 1 for each MOS transistor (and also in some subsequent figures) indicate that the transistors may be OTP transistors with charge-trapping sites, as described in co-pending U.S. application Ser. No. 13/045,754 (filed Mar. 11, 2011 as a Continuation-In-Part of U.S. Ser. No. 12/783,215) and as shown in FIG. 8 and described below. Such transistors are programmed by Fowler-Nordheim (FN) tunneling injection. Other forms of memory devices programmable by Fowler-Nordheim tunneling may alternatively be used, for example devices with a physical trapping layer such as SONOS (Silicon-Oxide-Nitride-Oxide-Silicon) transistors or devices with a different construction such as SOI (Silicon-on-Insulator) transistors, FinFETs etc. The memory bit-cell 100 may be configured in two modes, as shown in FIG. 1: data programming mode (circuit 106) and data reading mode (circuit 108). During data programming, one MOS device from the pair (e.g. device 102) is programmed while the other device (e.g. device 104) is inhibited. As shown in FIG. 1, in an implementation, data programming may comprise biasing the source of the programmed side (side A in the example shown) at 0V and inhibiting the other side of the differential pair by biasing the source (Sb), e.g. at 4.25V. The bias voltage applied to the source (Sb) is selected such that it is high enough to prevent damage or programming by FN tunneling in the inhibited device, but low enough to prevent damage and ensure correct operation of the control circuitry connected to the node. The two drains (Da and Db) are left floating and a bias voltage is applied to the gate of the bit-cell, G (e.g. 8.5V). The bias voltage applied to the gate of the bit-cell (G) is selected such that it is high enough to promote FN tunneling in the programmed device, but sufficiently low to prevent oxide breakdown in normal (i.e. non-defective) cells. In data reading mode, however, a significantly smaller gate bias voltage is used (e.g. 1.8V) and the two sources (Sa, Sb) are shorted together.

A number of memory bit-cells 100 may be arranged into an array with drivers for the word- and breakdown detection as well as sensing circuits connected to the bit-lines. In an example implementation, a bit-line comprises 4 terminals: Da, Db, Sa, Sb, and a word-line connects the common gate terminal, G, of the bit-cells (e.g. m bit-cells per word-line). This is similar to a conventional NOR array in which the word-line connects to the common gate of the word, and the bit-line connects to the transistor drains and runs orthogonal to the word-lines. In this specific example the bit-line consists of 4 terminals instead of 1, and there is no common source.

Although FIG. 1 and some subsequent figures all show the same device from the differential pair being programmed (device 102), it will be appreciated that this is by way of example only. Control circuitry around the memory bit-cell (or the array of bit-cells) may select which device is programmed and which is inhibited.

Breakdown Detection

As described earlier, it is not possible to exercise the OTP memory during test and so the locations of any defective memory cells within a memory array are not known. In the arrangement shown in FIG. 1, the source of the programmed side (Sa in circuit 106) is biased at 0V and is connected through a Breakdown Detector (BD) circuit 110 (which may also be referred to as a BD block or module). The term 'breakdown' (or breakdown event) is used herein to describe an abnormality which occurs during programming and which causes the program current to exceed expected levels (and as such can be described as abnormally high currents). In an example, the program current may be considered abnormally high if it equals or exceeds a value which is ten times (i.e. an order of magnitude) higher than the +3σ value of the distribution. In other examples, the program current may be considered abnormally high if it exceeds a different threshold value.

This BD circuit 110 monitors the integrity of gate oxides within the OTP transistor being programmed during the high-voltage stresses which occur during programming. Depending on the design, the BD circuit may also limit the current on breakdown which prevents (or reduces) damage to any parts of the memory which are shared between cells (e.g. across the word-lines of a memory array) and so preserves the operation of the rest of the memory block. Furthermore, if a problem in writing data to a particular memory cell can be detected (e.g. by monitoring the impedance at terminal BD), it may be possible to manage the data that was destined to a defective part of the memory, e.g. by rewriting that data to another part of the memory and by marking as invalid the defective word-line (as is described in more detail below).

Figure 2:
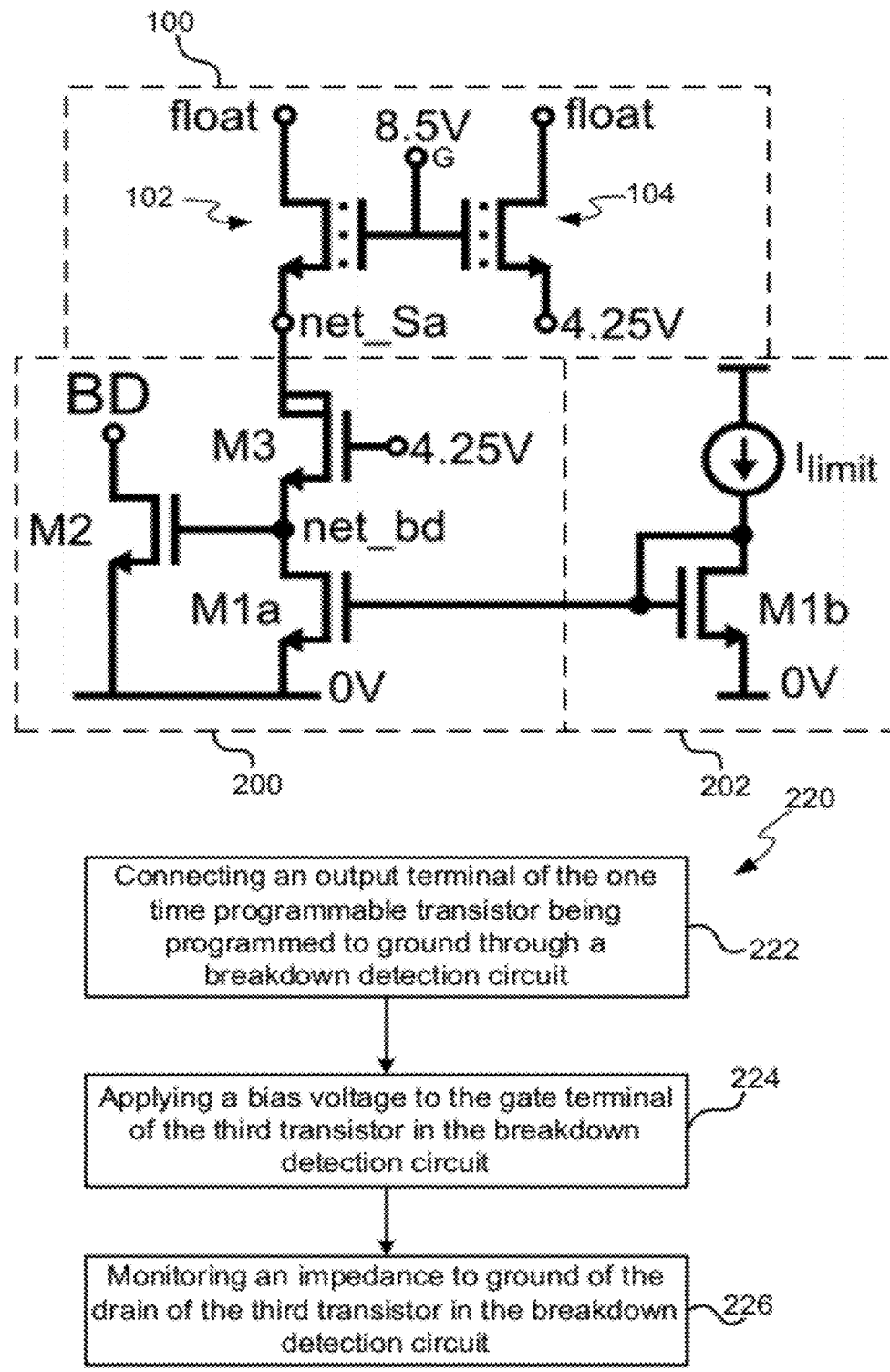
FIG. 2 shows an example of a breakdown circuit which comprises three transistors and an example method of detecting breakdown using the breakdown circuit.

FIG. 2 shows an example of a BD circuit 200 which comprises three NMOS transistors M1a, M2 and M3 (referred to herein as the first, second and third transistors in the BD circuit respectively) and a flow diagram 220 showing an example method of detecting breakdown using such a circuit 200. The BD circuit 200 is shown connected to a memory bit-cell 100 as described above. The drain of the third transistor, M3, is connected (in use) to the source Sa of the MOS device 102 within the bit-cell 100 that is being programmed (block 222). The source of that third transistor M3 is connected to both the drain of the first transistor, M1a, and the gate of the second transistor, M2. The sources of both the first and second transistors, M1a and M2, are connected to 0V and the gate of the first transistor M1a is connected to a current reference circuit 202 which may, in some examples, be considered part of the BD circuit (i.e. the BD circuit may comprise both circuit 200 and circuit 202). The terminal BD (the drain of the second transistor, M2) may be connected to a sensing circuit which detects the impedance of that terminal to ground in order to monitor when breakdown occurs.

It is the current reference circuit 202 which sets the limit of the current on breakdown and the first transistor M1a acts as a current limiter within the BD circuit 200 and bit-cell 100. By limiting the current to a safe limit (set by the current reference circuit 202), any circuitry shared across a memory array is protected from overstress caused by one or more defective cells.

The current reference circuit 202 comprises a further NMOS transistor M1b with device dimensions matching the first transistor in the BD circuit M1a and the reference current $I_{limit}$ arranged such that the reference current is coupled to both the drain and gate of the transistor M1b and the source of the transistor M1b is connected to 0V. It is the gate connection to the transistor M1b which is coupled to the first transistor in the BD circuit M1a, which, as described above, acts as a current limiter within the BD circuit 200 and bit-cell 100. This is because it mirrors the $I_{limit}$ current which is set to be higher than the expected $I_{gate}$ leakage of the MOS device which is being programmed. As a result when breakdown has not occurred, M1a works in the linear region while M1b is in the saturation region.

The circuit symbol used in FIG. 2 for NMOS transistor M3 indicates that the transistor is a 'high-voltage transistor', where this term is used herein to refer to a transistor which can sustain the entire programming voltage (e.g. 8.5V in the example shown in FIG. 2) on the drain in case of breakdown. In other examples of a BD circuit, one or more of the other transistors (M1a, M1b and M2) may also be high voltage transistors. The same circuit symbol is used to indicate high-voltage transistors in FIG. 7.

During the programming of bit-cell 100, the gate of the bit-cell is biased at a sufficiently high voltage to produce a shift in threshold voltage (e.g. 8.5V) and the gate of the high-voltage device M3 is biased such that during breakdown, net_bd can rise to a voltage high enough to turn second transistor M2 on, but not so high that the first and second transistors, M1a and M2, are damaged by voltage overstress (block 224). At this biasing point, M3 is on, M2 is off and the nets net_Sa and net_bd are pulled down to 0V. In an example implementation, 4.25V may be used to bias the gate of M3 if available (e.g. where 8.5V is generated using a charge pump, then half of that voltage is also available). In other examples, a lower available voltage may be used, e.g. 3V supplied by a battery.

If gate oxide breakdown occurs during programming stress (i.e. during a write operation), the $I_{gate}$ leakage of the programmed MOS device increases significantly. The breakdown event triggers the current limiter such that device M1a works in the saturation region to clamp the current to the $I_{limit}$ reference. As a result of this, net_Sa increases from 0V up to the bias voltage of the bit-cell (8.5V in the example shown) and net_bd increases to a value such that device M3 drains the same current as device M1a (e.g. around 3.75V in the example shown). This in turn switches on device M2 and changes the impedance of terminal BD. The breakdown event can therefore be detected by a digital controller (or other sensing circuitry) connected to terminal BD (block 226).

The ability to detect when breakdown occurs enables data management methods to be employed to accommodate the memory failure, e.g. by re-writing the data to an alternative location. Without this, the data written to the failed bit-cell will be lost. In addition, the process speed can be improved as breakdown may be detected after only a fraction of the write time and as soon as it is detected, the write may be aborted and a new write commenced (e.g. of the same data in a new location).

In addition to enabling breakdown to be detected, the BD circuit 200 also protects the system from further damage. This is because once breakdown has occurred and M1a has clamped the current to the reference limit, the gate oxide is no longer stressed by high voltage.

As described above, multiple bit-cells 100 may be arranged in bit-lines, i.e. rows of bit-cells with common Sa, Sb, Da and Db terminals. In an example implementation, a single BD circuit 200 may be used for each bit-line and thereby reduce the amount of circuitry that is required. In this example, when writing a word to the array of bit-cells, as soon as any bit-line fails then the whole word has failed (an OR operation). In other example implementations, however, the BD detector for each bit-line may be separately monitored which enables identification of individual failing cells.

In addition, or separately, the current reference circuit 202 may be shared between multiple BD circuits in order to provide a common current reference to each BD circuit. For example, where there is an array of bit-cells 100 and corresponding BD circuits 200 (e.g. one BD circuit per bit-cell or per bit-line), a single current reference circuit 202 may connect to the gate of the first transistor M1a in each BD circuit 200.

Although the BD circuit 200 is described with reference to a particular bit-cell arrangement, where the bit-cell comprises OTP MOS devices, such as those described below with reference to FIG. 8, the BD circuit may be used in other situations, e.g. with other bit-cell arrangements where these bit-cells need not be OTP cells. In an example, the BD circuit may be used for any memory cell that uses FN programming signified by high voltage and low programming current. In another example, the BD circuit may be used anywhere where a high voltage is used for programming a memory cell and as a result breakdown of the device may occur, (e.g. it may be used with EEPROM or flash memory cells, although such cells are fully testable prior to use so are less likely to exhibit unpredictable failure on writing).

As described above, although FIG. 2 (and other figures) shows one device from the differential pair being programmed (device 102), it will be appreciated that this is by way of example only. Control circuitry around the memory bit-cell (or the array of bit-cells) may select which device is programmed and which is inhibited and where a BD circuit is used may be arranged to connect the BD circuit to the appropriate device within a bit-cell (e.g. in block 222 of the flow diagram 220 in FIG. 2).

Although FIG. 2 shows the BD circuit 200 being connected between the source, Sa, of the device being programmed and ground, in another example, a BD circuit may be connected between the high-voltage line (which provides the 8.5V in the example shown) and the common gate connection, G, in the memory cell. In such an example, the BD circuit may comprise an inverted version of the BD circuit 200 shown in FIG. 2 (e.g. where all NMOS devices are swapped for PMOS devices and by swapping the circuit from high-side to the low-side of the memory array, etc).

Flag Bit Cell

As described above, an array of bit-cells 100 (as shown in FIG. 1) when un-programmed contains random stored data. The value of any bit-cell is determined by the native mismatch between the two devices in the differential pair and this is unpredictable. This means that a control system cannot read the contents of an array of bit-cells and determine which words have been written and which have not (i.e. which cells contain data and which do not).

Figure 3:
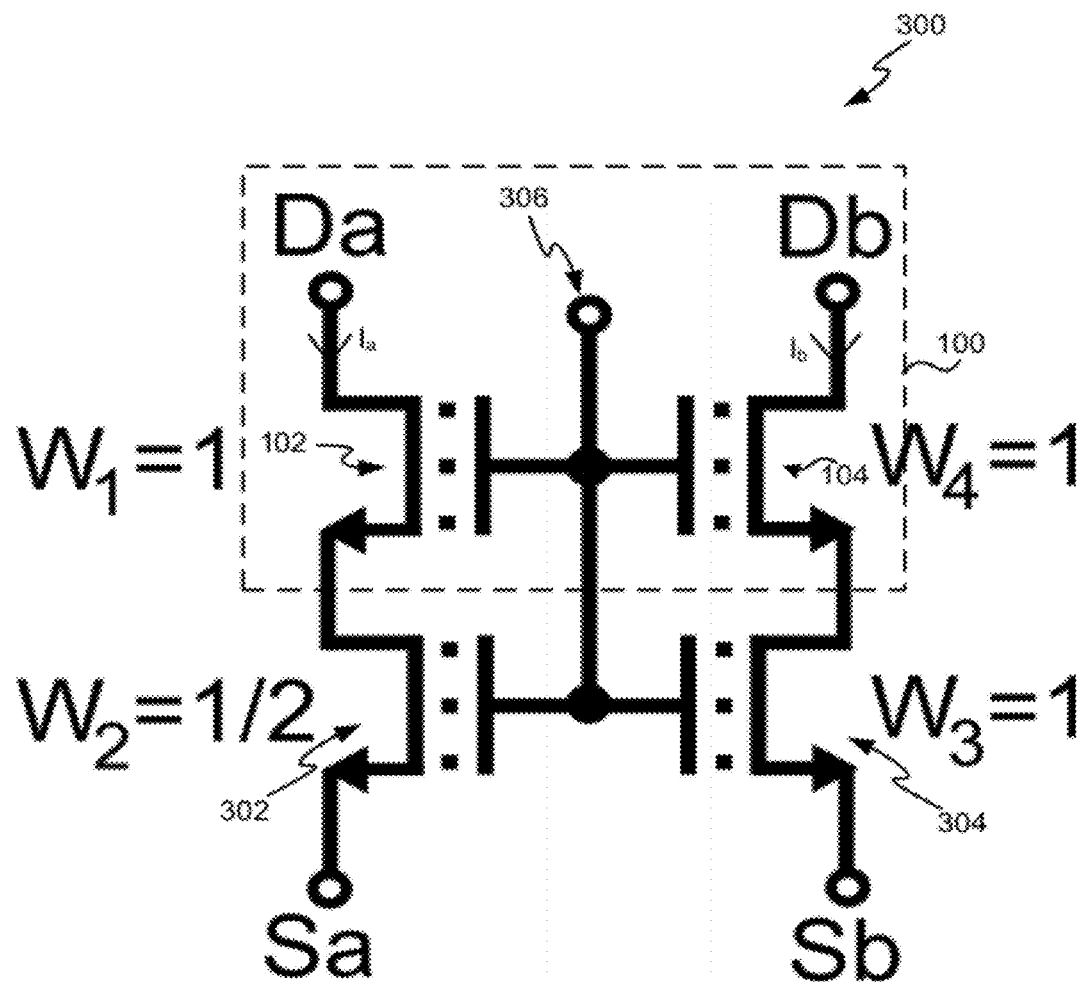
FIG. 3 shows a circuit diagram of a flag bit cell.

FIG. 3 shows a flag bit cell 300 which is a variant of the bit-cell 100 but which always reads in a defined state without requiring a write operation. As a result it is possible to read these cells at a test stage (e.g. at chip test) to check for errors, although breakdown may still occur when the cells are written and a breakdown detector circuit, as described above, may be used to detect such occurrences. In operation these flag bit cells may be used to identify if a word has been written or not.

The flag bit cell 300 comprises a bit-cell 100 (as described above) with the addition of two further NMOS devices 302, 304. The drain of one of these additional devices is connected to the source of one of the differential pair of devices in the bit-cell 100 and the drain of the other of these additional devices is connected to the source of the other of the differential pair of devices. There is a single gate connection 306 to all four NMOS devices 102, 104, 302, 304. The two additional devices 302, 304 act as a series resistor for the respective upper device and as the devices 302, 304 are of different widths the resistors are of different values. In the example shown, the resistor on the left side (side A) is twice as big as the right one (side B) because it has been drawn half width (device 302 has a width $W_2$ which is half that device 304). In another example, different width ratios may be used.

Although it might appear that an alternative would be to use a mismatched differential pair of devices (i.e. a cell which comprises just two mismatched devices without the two additional devices shown in FIG. 3), e.g. one device with a width W and the other device with a width W/2, this would not give good results since the different capacitances (on the drain side) set an unbalanced load for the differential pair. In the arrangement shown in FIG. 3, however, the different capacitance on the source sides is unimportant because Sa and Sb are shorted during read operations (e.g. as shown in FIG. 1).

The structure shown in FIG. 3 introduces a native asymmetry of the differential pair because the current $I_A$ is always lower than $I_B$. Therefore the flag bit cell is an unbalanced differential pair which gives a well-defined native (i.e. unprogrammed) output when read.

It is still possible to program the flag bit cell to have the opposite output by switching the unbalanced side. In programming the flag bit cell, the side with the smaller resistor (side B in the example shown) is programmed, thus the native stronger side becomes the weaker one, switching the stored data. To program side B, the source on the other side, Sa, is biased at 4.25V and source on the side being programmed, Sb, is connected to 0V (and may be connected through a BD circuit). As shown in the diagram of FIG. 1, a gate voltage of 8.5V is applied to the common gate terminal 306 and the drains Da, Db are left floating.

A memory array may comprise one or more flag bit cells as shown in FIG. 3. In an example, each memory bit-cell may be a flag bit cell; however as the size of a flag bit cell is considerably larger than a bit-cell, the use of flag bit cells may be limited to particular positions in a memory array and one example is described below with reference to FIG. 4.

FIG. 3 shows the additional devices as being OTP devices with charge trapping sites (as described below) such that all four MOS devices are fabricated in the same way; however, in other examples, other MOS devices may be used or only a subset of the devices may be OTP devices with charge trapping sites (e.g. devices 102 and 104) with the remaining devices comprising other MOS devise with appropriate gate breakdown voltages.

Although the flag bit cell is described as being used in combination with OTP memory, such cells may be used in combination with bit-cells (e.g. as shown in FIG. 1) to mark regions of data (e.g. words of data) as being old (e.g. where the data has been updated and rewritten elsewhere in a memory structure) and consequently can enable an OTP array to emulate MTP memory.

It will be appreciated that where transistors are shown having active areas with the same width (e.g. width $W_1$), this refers to the designed widths of the active areas (be that formed from a single active area, or a combination of multiple active areas). Due to manufacturing tolerances and variations, the actual widths of the active areas in the transistors when manufactured (or of the mask openings when produced) may be slightly different (which hence leads to the unpredictable native mismatch, described above). As a result, such transistors may be described as being substantially identical or substantially the same.

In an alternative flag bit cell design, a differential pair of transistors may be used and the gate lengths of the two transistors may be varied. This results in the transistors having the same drain capacitance but the device with the longer gate has the lower currents (until the shorter gate device is programmed).

Memory Array

Figure 4:
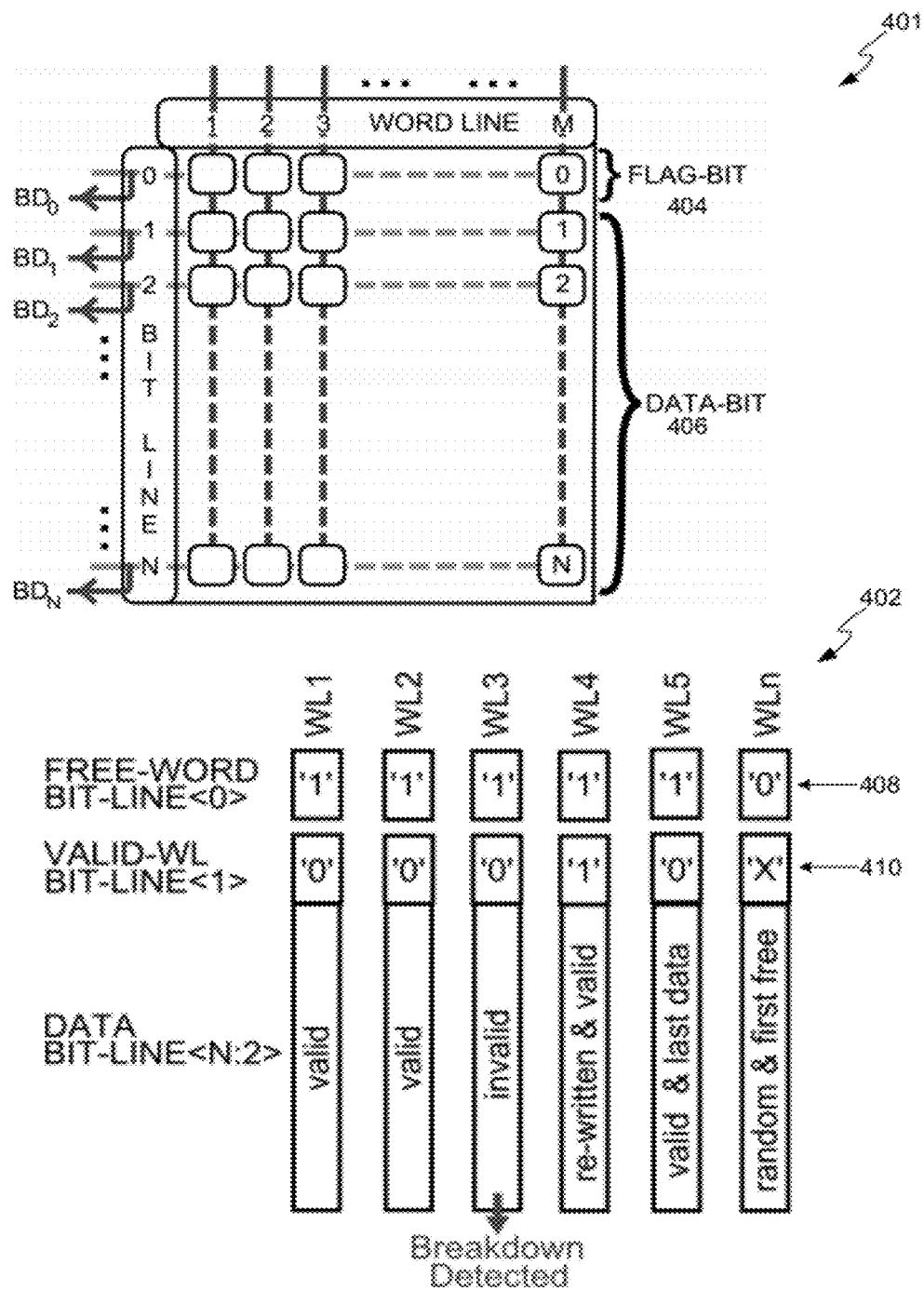
FIG. 4 shows two schematic diagrams of a memory array.

The breakdown detection circuit 200 and flag bit cell 300 described above may be used in combination with a memory array as shown in FIG. 4. The memory array is arranged in M word-lines and N bit-lines, where each bit-line comprises of four terminals (Sa, Sb, Da, Db, as described earlier) and the word-line comprises the common gates of the programmable NMOS devices. FIG. 4 shows two diagrams, the first diagram 401 shows the memory array and the second diagram 402 shows the word structure.

As shown in the second diagram, each word comprises two auxiliary bits (bit-line 0 and 1) and N-1 data bits and in the example shown, only the first of these auxiliary bits is formed from flag bit cells 404 (e.g. flag bit cell 300) with the remaining bits all being bit-cells 406 (e.g. bit-cells 100, which may also be referred to as 'data bits'). In another example, both auxiliary bits may be stored in flag bit cells; however this would increase the size of the array. The first auxiliary bit 408, which is referred to as the 'FREE WORD' bit and is stored in a flag bit cell 404, is used to indicate which word has been written and which has not been written. This means that a control system can read this bit-line and determine where the next free word is. The second auxiliary bit 410, which is referred to as the 'VALID-WL' bit (and is stored in a bit-cell 406), is used to indicate if a breakdown event was detected (using a breakdown detector circuit as described above) during the writing of the previous word. In the example shown in FIG. 4, the VALID-WL is written as a '0' unless a breakdown has been detected when a '1' is written while re-writing the data to the next available free word. Unwritten bits have a random value (as indicated by an 'X' in diagram 402) as this bit-cell is not a flag bit cell.

Figure 5:
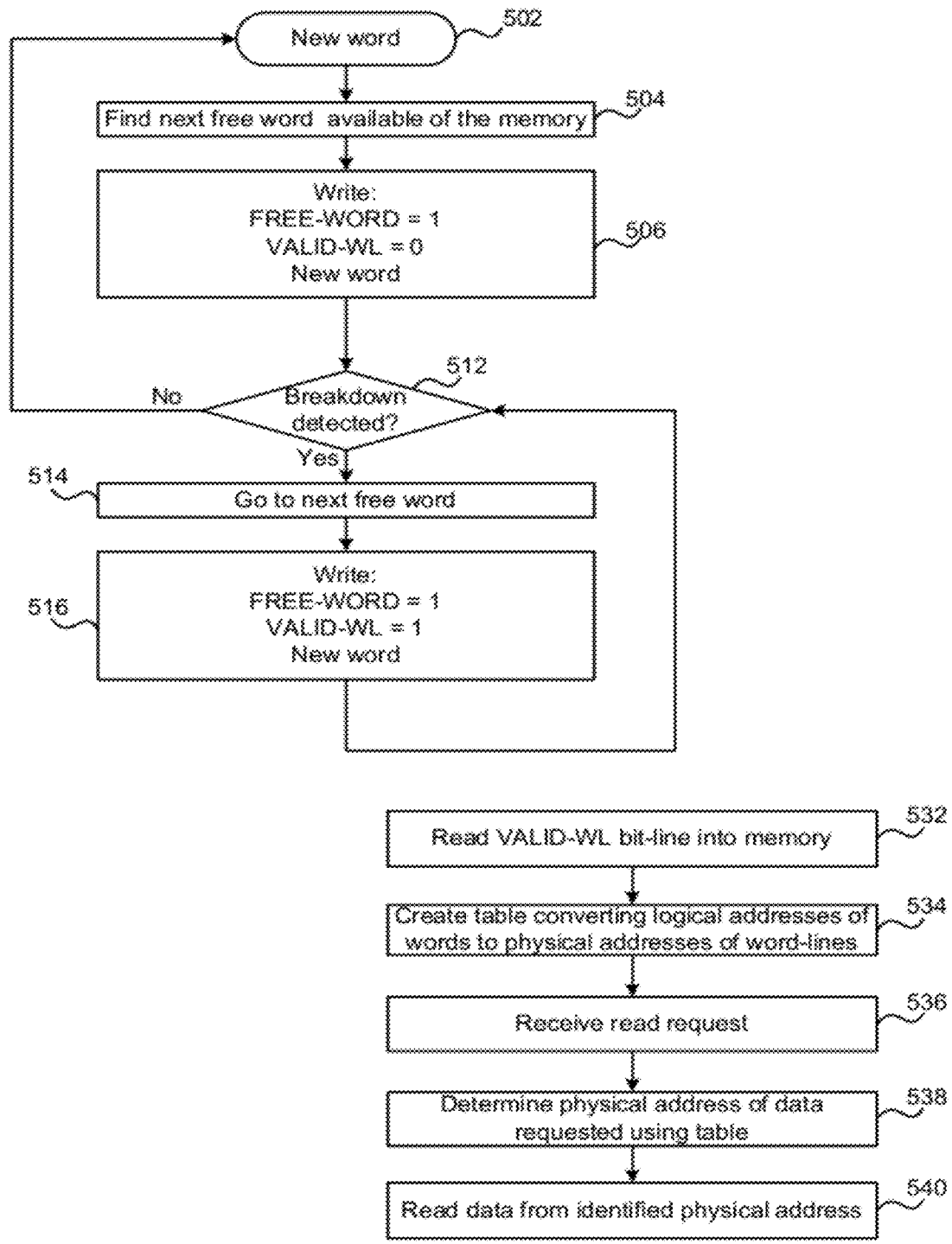
FIGS. 5 and 6 comprise flow diagrams of example methods of writing to a memory array such as shown in FIG. 4 and example methods of reading from such a memory array.

The method of writing to such a memory array is shown in FIG. 5. In order to write a new word 502, the next available free word in the memory is found (block 504) and then, in a single write operation (block 506), the FREE-WORD bit is set to indicate that the word in the memory has been written (e.g. by programming the flag bit cell to read a '1' rather than the default stored value of '0'), the VALID-WL bit is set to a default value (e.g. to '0' to indicate that a breakdown was not detected when writing to the previous word in memory) and the new word is written. If a breakdown is detected while the word is being written (e.g. during block 506 and as detected in block 512), then the next free word in the memory is identified (block 514) and in a further single write operation (block 516), the FREE-WORD bit is set to indicate that the word is no longer free, the VALID-WL bit is set to a value to indicate that a breakdown did occur (e.g. set to a value of '1') and the word is rewritten to the memory. Consequently, a value of '1' in the VALID_WL bit indicates that the previous wordline is invalid. If breakdown occurs when rewriting the word ('Yes' in block 512), then the rewriting process (blocks 514-516) may be repeated until the word is successfully written. In some examples, a counter of sequential breakdown may be implemented to limit the number of re-write attempts which are performed.

The data writing method is also illustrated by word-lines WL3 and WL4 in diagram 402 of FIG. 4. In this example, breakdown is detected when writing to word-line WL3 and as a result the word is rewritten to word-line WL4 and this time breakdown does not occur. Prior to rewriting the word in word-line WL4, the FREE-WORD bit is set to '1' and the VALID-WL is set to '1' to indicate that the previous word-line WL3 contains invalid data. When subsequently writing to word-line WL5, the VALID-WL bit can be set to '0' because the word was successfully written to word-line WL4. The fact that word-line WL5 is the last word-line to contain a FREE-WORD bit set equal to '1' indicates that this is the last word-line which contains data. Subsequent word-lines WLn contain random data with the exception of the flag bit cell which stores the FREE-WORD bit which has the native (un-programmed) value of '0', which can be ascertained at chip-test.

This memory array and method of writing to such an array allows the memory space to be managed in an efficient manner. There are only 2 bits of data overhead for each word and no write time overhead, i.e. there is still only one write cycle per word (unless breakdown occurs) and the status bits (FREE-WORD and VALID-WL) are written with the data bits, as shown in FIG. 5. If, however, the VALID-WL status bit was written within the same word-line as the word to which it referred, this would require two write cycles per word (one cycle for the word and one cycle for the validity bit), even where no breakdown occurs, and would significantly increase the overall write time.

When reading from the memory array, the VALID-WL line may be read into temporary memory (e.g. into a SRAM or any temporary memory structure, block 532) and a table created (block 534) which converts logical addresses for data words to physical addresses (e.g. the address of the word-line in which the data is actually stored). In the example shown in diagram 402 of FIG. 4, the first data word is mapped to WL1, the second to WL2, the third to WL4 and the fourth data word to WL5. The creation of this data mapping table has the effect that a microprocessor accessing the data can always read the data in a defined time interval, even if there has been multiple successive breakdown events (e.g. because of a faulty region of memory). As shown in FIG. 5, a read request (received in block 536) is converted from a reference to a logical address to a reference to the appropriate physical address (block 538) prior to reading the data (block 540).

Alternatively, the data may be read directly from the memory array when required without first creating a mapping table as described above. Each reading operation for a word requires reading two adjacent word-lines: to read the data of word-line n, both n and n+1 are read. If VALID-WL for word-line n+1 indicates that there was not a failure in word-line n (e.g. VALID-WL$_{n+1}$=0), then the word is stored in word-line n. If, however, VALID-WL for word-line n+1 indicates a failure in word-line n (e.g. VALID-WL$_{n+1}$=1), then the data has been written to word-line n+1 (and the data in word-line n should be ignored). In this situation, word-line n+2 is also read to check that the data in word-line n+1 is valid (e.g. because if there was a failure when rewriting the word to word-line n+1, this would be indicated in word-line n+2 and the data would have be rewritten again to word-line n+2). Where this reading method is used, the reading efficiency may be increased by reading all the written words in series and extracting the valid data based on the values of the VALID-WL bit-line.

The method of writing to the memory array shown in FIG. 5 works well if failures occur on non-adjacent word-lines or if failures of the VALID-WL bit are rare. In an example, there may be 1 VALID-WL bit for approximately 80 data bits and as a result there is approximately a 1% chance of a breakdown affecting the VALID-WL bit.

Figure 6:
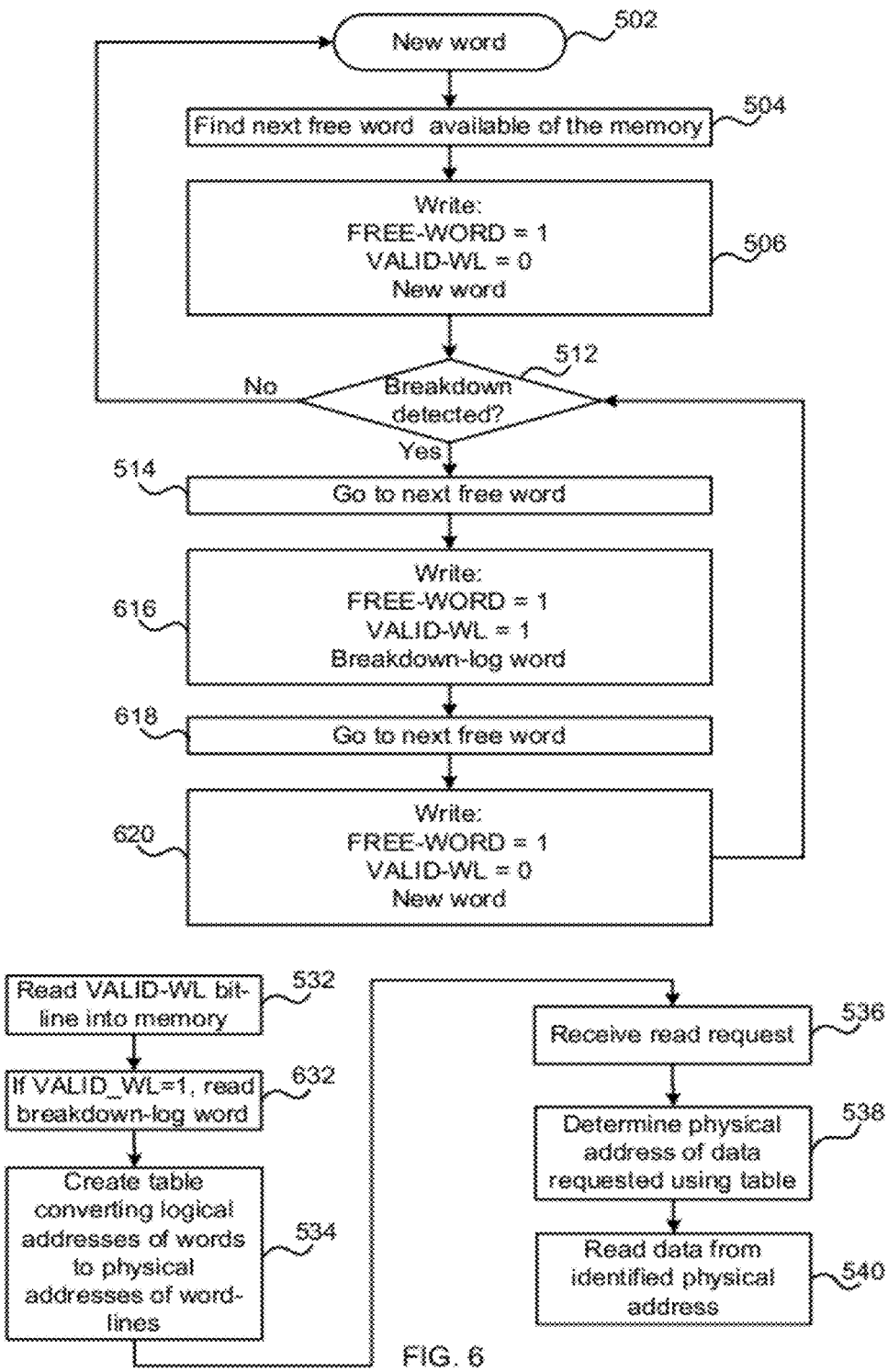

FIG. 6 shows another example method of writing to a memory array such as shown in the first diagram 401 of FIG. 4. In this example method, in the event of breakdown (as detected in block 512), an additional breakdown-log word is written (within the write of block 616). As shown in FIG. 6, the re-write attempt (block 616) after breakdown first stores a word (referred to as the 'breakdown-log word') that identifies the first physical word-line address at which breakdown occurred. In the example shown in the lower diagram 402 of FIG. 4, this address would correspond to WL3. The data ('new word') destined for the cell in which breakdown occurred is written to the next physical word-line address (block 618-620). If there are multiple defective bit lines, the log word is written to the next word until the write is successful (i.e. blocks 514 and 616-620 are repeated).

The method shown in FIG. 6 includes a breakdown-log word which identifies the word-line at which the problem started and its integrity is confirmed by the VALID-WL in the following word in which the data is written (as written in block 620). This allows multiple consecutive defective word-lines to be clearly identified.

FIG. 6 also shows an example method of reading from a memory array when a breakdown-log word has been used in writing to the memory array. When reading from the memory array, the VALID-WL line may be read into temporary memory (e.g. into a SRAM or any temporary memory structure, block 532) and where a value of VALID-WL=1 is read, a breakdown-log word is also used. When the table which converts logical addresses for data words to physical addresses (e.g. the address of the word-line in which the data is actually stored) is created (in block 534), both the VALID-WL values and any breakdown-log words are used.

In an example, either the method of writing shown in FIG. 5 or the method shown in FIG. 6 may be used dependent upon how critical the data being written is.

It will be appreciated that although this example shows particular values of the FREE-WORD bit and VALID-WL bit indicating particular states, in other examples the opposite state may be used for either or both bits.

Worddrive Circuit

As described above and shown in FIG. 1, the bias voltage which is applied to the common gate terminal G (or 306 in the case of the flag bit cell in FIG. 3) is significantly different for read and write operations. The bias voltage which is required to programme the bit-cell is much higher (e.g. 8.5V) than that which is required to read the value stored in the bit-cell (e.g. 1.8V) and may be dependent upon the mechanism used to perform the programming (e.g. Fowler-Nordheim tunneling in the particular OTP device example given below). Typically, the control circuitry around a memory array comprising multiple bit-cells and/or flag bit cells comprises a worddrive circuit for read operations and separate worddrive circuit for write operations.

Figure 7:
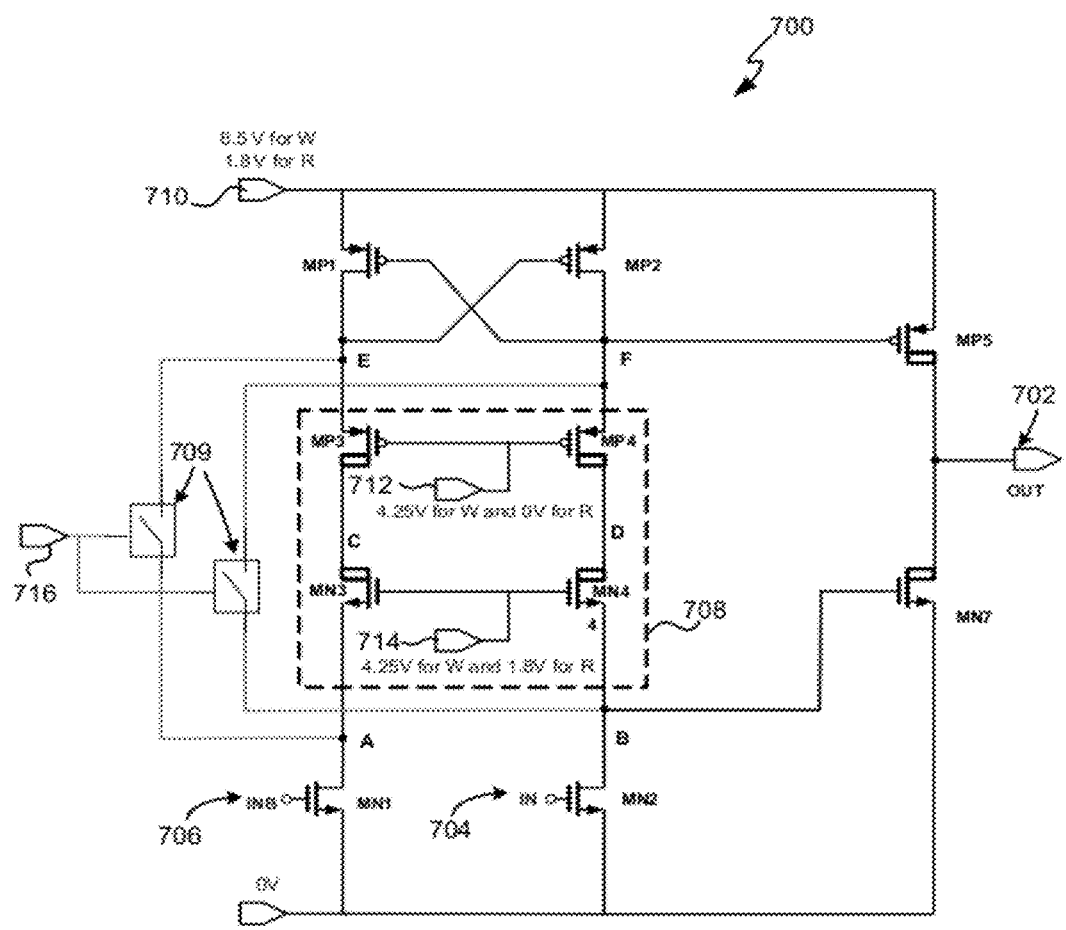
FIG. 7 shows a circuit diagram of a worddrive circuit which can be used for both read and write operations.

FIG. 7 shows a circuit diagram of a new worddrive circuit 700 which can be used for both read and write operations and therefore reduces the area on the silicon chip that is required for worddrive circuits. By reducing the area used, the cost of a chip can also be reduced. The output 702 (OUT) of the worddrive circuit 700 is connected to the common gate of the bit-cell, G (or common gate 306 of the flag bit cell) and biases the word-line at the right voltage levels for write and read operations. The circuit may therefore be considered to be a flexible level shifter, from the digital input 704 (IN), which is the digital command that turns the worddrive on/off, to the output signal 702 (OUT). The second input 706 (INB) is the inverse of the input 704 (IN) and may alternatively be written as $\overline{IN}$.

The worddrive circuit 700 shown in FIG. 7 comprises a latch formed from PMOS transistors MP1 and MP2, a cascode 708 formed from two PMOS transistors MP3, MP4 and two NMOS transistors MN3, MN4, two input NMOS transistors MN1, MN2, two output transistors MP5, MN7 (one PMOS and one NMOS) and two bypass switches 709. As described in more detail below, the cascode 708 acts to protect the gates of MN7 and MP5 from over-voltage. In addition, it protects the input devices MN1, MN2 and the latch devices MP1, MP2 from the high voltages used when writing to the memory, although in some implementations, these input and latch devices may be protected in other ways. The bypass switches 709 operate to short circuit the cascode 708 during read operations (when the protection is not required) in order that the speed of reading operations is not impacted by the presence of the cascode 708.

In the example shown, the transistors denoted MNx (where x=1-4, 7) are n-channel devices and the devices denoted MPy (where y=1-5) are p-channel devices. Each bypass switch 709, which is shown as a generic switch, may be implemented as a single transistor (PMOS or NMOS) or a parallel NMOS transistor and PMOS transistor. Furthermore, in the example shown, all the devices except the latch devices MP1, MP2 and the input devices MN1, MN2 are high voltage devices (as indicated by the circuit symbols used). In addition, the bypass switches 709 may be implemented with high voltage devices (e.g. high voltage NMOS transistors) such that they can handle the high programming voltage which is across them during programme mode. It will be appreciated, however, that in other examples, a different number of high voltage devices may be used.

The structure of the worddrive circuit shown in FIG. 7 is now described in more detail. The sources of the latch devices MP1, MP2 are connected to the bias line 710 and the drains are connected to the cascode 708. The drains of the input devices MN1, MN2 are connected to the NMOS side of cascode 708 and the sources of these devices are connected to 0V. The source) of the PMOS output device MP5 is connected to the bias line 710 and the drain is connected to the drain) of the NMOS output device MN7. The source of MN7 is connected to 0V. The gate terminal of the PMOS MP5 is connected to the output of the latch (e.g. drain of latch device MP2) and the gate terminal of the NMOS MN7 is connected to the drain of the input transistor MN2 (at point B). The output signal 702 (OUT) is taken from the drains of the output NMOS and PMOS.

The cascode 708 comprises four devices, the upper pair of devices MP3, MP4 has a common gate terminal 712 and the lower pair of devices MN3, MN4 also has a common gate terminal 714. These common gate terminals 712, 714 are biased so as to switch on the devices adequately without damaging them with a high voltage (as described above 4.25V may be used where it is a suitable and available voltage). MP3, MP4, MN3, MN4 for write operations (e.g. biased at 4.25V as shown in FIG. 7). In the example shown, for read operations, the PMOS devices have a gate voltage of 0V (devices switched on) and the NMOS devices have a reduced, but non-zero gate voltage (e.g. 1.8V). However, in other examples, these devices may be switched off for read operations (but the arrangement shown in FIG. 7, may result in the circuit switching a little faster). The sources of the PMOS devices MP3, MP4 are connected to the drains of the latch devices MP1, MP2 and the sources of the NMOS devices MN3, MN4 are connected to the drains of the input devices MN1, MN2. As explained above, the cascode 708 acts to protect the input devices MN1, MN2 and latch devices MP1, MP2 and the gates of the output devices (MP5, MN7) from the high bias voltages used during the write process (also referred to as 'programming stress'); however, the cascode operates very slowly at low voltages, i.e. in read mode. The NMOS cascode devices MN3, MN4 limit the voltage for A and B within a reliable range for the input devices MN1, MN2 and the output NMOS MN7 and the PMOS cascode devices MP3, MP4 limit the voltage for E and F within a reliable range for the latch devices MP1, MP2 and for the gate of the output transistor MP5.

The two bypass devices 709 are connected around the cascode 708 and share a common terminal 716. By closing the switches for read mode and opening them for write mode (e.g. 0V for write and 1.8V for read), the cascode 708 is short circuited during read operations and this increases the speed of those operations. For write operations, reliability is more important, while the speed of the worddrive circuit is not a concern compared to the required programming times. With the use of bypass devices 709 as shown in FIG. 7, the silicon area for the worddrive circuits can be half that of the circuit without these switches 709 while maintaining the same speed during read operations.

In a variation of the circuit shown in FIG. 7, there may be a two-way switch at the source of MN7 connecting to ground or 4.25V. In such a variation, the gate of MN7 is connected to node D instead of node B.

An OTP Transistor with Charge-Trapping Sites

As described above and shown in FIG. 1-3, the devices used within the bit-cell and/or flag bit cell may comprise OTP transistors with charge-trapping sites or may comprise alternative transistor structures. FIG. 8 shows two cross-sectional diagrams 801, 802 through an example OTP transistor with charge-trapping sites. Such a transistor shares an oxide layer 804 with a thick oxide (or double gate oxide) I/O transistor and shares implants (including source/drain extensions 806) with a thin-oxide core transistor in a dual oxide CMOS technology.

The thick oxide layer 804 in the OTP MOS device may, for example, be 30-70Å thick and in a particular example, the thick oxide layer 804 may be 52Å thick. The source/drain extensions 806 are highly-doped, shallow and with pockets (as shown in the lower diagram 802 which is described below) and in this example, the source/drain extensions use the SVT (standard threshold voltage) implants. In other examples, other options for thin-gate implants may be used (e.g. LVT or HVT). In an embodiment, the available implant option (on the CMOS process being used) which provides the highest threshold voltage may be used (e.g. HVT, where the available options are LVT, SVT and HVT). In a further variation, an OTP transistor may be formed with a thick oxide and an SRAM implant instead of using HVT implants.

In some examples, the highly-doped, shallow source/drain extensions with pockets may be formed in multiple steps to achieve transistors with different threshold voltages. In such an example, the implants resulting in the highest threshold voltage may be combined to form the OTP device.

The lower diagram 802 in FIG. 8 shows a more detailed cross section through the OTP NVM device. It can be seen that the source/drain extensions 806 comprise high dose, shallow core LDD (lightly doped drain) implants 808 which are the same polarity as the source/drain (n-doped in the example shown) and pocket (or halo) implants 810 which are of the opposite polarity.

The use of thick gate oxide increases charge retention performance, due to lower tunneling probability compared with thinner oxide. However, when shallow and high dose source/drain extensions are implanted into the thick gate oxide, a high percentage of the implant species passes through the oxide and a part of it becomes lodged within the oxide. This creates additional charge traps along the edges of the gate and therefore introduces a process-induced trap area 812 at the longitudinal gate edges. This process-induced trap area 812 is focused on the key zones where the voltage threshold shift occurs because it is above the most doped channel areas. As a result, memory read margin of the OTP NVM device is further enhanced because the process-induced trap area 812 increases voltage threshold shift.

FIG. 8 shows the channel length, L, and because the additional trap sites are at the edges of the gate, if the channel length is reduced, the additional trap sites become more dominant. The strong LDD/pocket implants enables use of a much shorter minimum channel length, whilst still providing enhanced voltage threshold shift. In an embodiment, a channel length may be used which is much shorter than is typically used for an I/O transistor and in some embodiments, the channel length may be selected to be as short as possible whilst still providing sufficient threshold voltage. By reducing the channel length, L, the bit-cell size of the device is reduced and a dense array of OTP memory cells can be built.

The OTP NVM device described above (and shown in FIG. 8) exploits the combination of thick gate oxide and aggressive source/drain extensions for Fowler-Nordheim tunneling as a programming method. This results in low power requirements for programming so that bit-cell may be programmed during the operation of the chip (if required). In addition, the charge trapping sites 812 improve the data retention performance compared to other OTP transistors and can be used to provide reliable OTP devices. Data retention tests show that the threshold voltage shift remains greater than 500 mV after 10 years at 125° C. The device can be integrated on existing dual gate oxide CMOS technology without any additional masks or process steps. Experimental results from data retention tests with different types of implant have also shown that such an OTP transistor provides a higher threshold voltage shift and better data retention than a standard transistor and HVT implants provide improved performance (in terms of data retention and threshold voltage shift) over SVT implants.

Conclusions

The breakdown detector circuit, flag bit cell and worddrive circuit described above may be used independently of each other or in any combination. These elements (and any such combination thereof) may be used in relation to memory devices programmed by FN tunneling or may be used with other memory devices. In a first example, a memory element may comprise all the aspects described above. In another example, the worddrive circuit may be used without any of the other aspects described and may be used to control EEPROM or another type of NVM. In another example, the worddrive and breakdown detection circuits may be used on a single-poly embedded EEPROM cell. In yet another example, the breakdown detector may be used on EEPROM cells which use Fowler-Nordheim tunneling to program the cells and hence involves high programming voltages. This may be separate from or in combination with use of the worddrive circuit. In a further example, the breakdown detector, flag bit cell and array structure may be used with the OTP transistor design described above with reference to FIG. 8.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

The invention claimed is:

1. A breakdown detection circuit for detecting abnormally high currents during programming of a memory cell at a programming voltage, the circuit comprising a first NMOS transistor, a second NMOS transistor and a third NMOS transistor, wherein the third transistor is arranged to sustain the programming voltage in case of breakdown, and each transistor comprises a drain, a source and a gate terminal and wherein:
   the drain of the third transistor is connectable to a bit-line terminal of a memory cell;
   the source of the third transistor is connected to both a drain of the first transistor and the gate of the second transistor;
   the source terminals of both the first and second transistors are connected to ground; and
   the gate terminal of the first transistor is connectable to a current reference module;
   the drain terminal of the second transistor is a breakdown detection output terminal; and
   wherein in use, the gate terminal of the third transistor is biased to switch the third transistor on and a change in impedance between the breakdown detection output terminal and ground provides an indication of a breakdown event during programming.

2. A breakdown detection circuit according to claim 1, wherein the memory cell comprises at least one memory device programmed using Fowler-Nordheim tunneling.

3. A breakdown detection circuit according to claim 2, wherein the at least one memory device comprises a one-time-programmable transistor, the one-time-programmable transistor comprising a thick oxide layer and source/drain extensions which are highly-doped, shallow and with pockets.

4. A breakdown detection circuit according to claim 1, further comprising the current reference module.

5. A breakdown detection circuit according to claim 4, wherein the current reference module comprises a fourth NMOS transistor and a reference current source, wherein the reference current source is connected to both a drain terminal and a gate terminal of the fourth transistor and to the gate terminal of the first transistor, and wherein the source terminal of the fourth transistor is connected to ground.

6. A breakdown detection circuit according to claim 1 wherein, in use and during breakdown, the first NMOS transistor is arranged to act as a current limiter within the breakdown detection circuit and the memory array.

7. A breakdown detection circuit according to claim 6 wherein the current reference module is arranged to set a current limit.

8. A method of detecting breakdown during programming of a memory cell at a programming voltage, the memory cell comprising one or more one-time-programmable transistors, the method comprising:
- connecting a bit-line terminal of the memory cell being programmed to ground through a breakdown detection circuit, the breakdown detection circuit comprising a first NMOS transistor, a second NMOS transistor and a third NMOS transistor, wherein the third NMOS transistor is arranged to sustain the programming voltage in case of breakdown and each transistor comprises a drain terminal, a source terminal and a gate terminal and wherein the drain terminal of the third transistor is connectable to the bit-line terminal of the memory cell being programmed; the source terminal of the third transistor is connected to both a drain terminal of the first transistor and the gate terminal of the second transistor; the source terminals of both the first and second transistors are connected to ground; the gate terminal of the first transistor is connected to a current reference module and the drain terminal of the second transistor is a breakdown detection output terminal;
- applying a bias voltage to the gate terminal of the third transistor in the breakdown detection circuit to switch the third transistor on; and
- detecting a change in impedance between the breakdown detection output terminal and ground in the breakdown detection circuit to give an indication that the breakdown event occurred during programming.

* * * * *